United States Patent [19]
Fairbanks

[11] Patent Number: 6,160,438
[45] Date of Patent: Dec. 12, 2000

[54] CHARGE SHARING SELECTORS

[75] Inventor: Scott M. Fairbanks, Mountain View, Calif.

[73] Assignee: Sun Microsystems, Inc., Palo Alto, Calif.

[21] Appl. No.: 09/227,223

[22] Filed: Jan. 8, 1999

[51] Int. Cl.[7] .............................................. H03K 17/693
[52] U.S. Cl. ............................................. 327/408; 327/99
[58] Field of Search .......................... 327/99, 403, 404, 327/407, 408, 410, 411, 413, 415, 416

[56] References Cited

U.S. PATENT DOCUMENTS

| | | | |
|---|---|---|---|
| 5,604,452 | 2/1997 | Huang | 327/99 |
| 5,796,288 | 8/1998 | Krech, Jr. et al. | 327/407 |
| 5,854,566 | 12/1998 | Kwon et al. | 327/403 |
| 6,037,829 | 3/2000 | Reddy et al. | 327/408 |
| 6,040,718 | 3/2000 | Henry | 327/71 |

*Primary Examiner*—My-Trang Nuton
*Attorney, Agent, or Firm*—Philip H. Albert; Townsend and Townsend and Crew LLP

[57] ABSTRACT

The selector circuit rapidly steers an event from a single input to one of two outputs depending on the binary value of a data signal controlling the selector, where events are received at an event input. A selection value, placed at a control input causes the selector circuit to steer the event to one of the outputs. For each change of value at the event input, one or the other of the outputs will change. Which output changes is determined by the selection value applied to the control input. The selector circuit uses variable or dynamic capacitances at the outputs to control which one of the outputs changes in response to an input event. Each node of the selector circuit includes a true line and a complement line. Pass gates are used to either couple the true lines of the outputs together or to couple the true line of each output and the complement line of the other output.

10 Claims, 6 Drawing Sheets

CHARGE SHARING SELECTORS

RELATED APPLICATIONS

This application is related to U.S. patent application Ser. No. 09/227,229, entitled "Charge Sharing Selectors With Added Logic", which was filed concurrently with the present application and is commonly owned with the present application. That application is incorporated by reference herein for all purposes.

BACKGROUND OF THE INVENTION

This invention relates to logic circuits and in particular to an improved selector circuit for use with event logic circuits.

One known technique for conveying information within computer systems, especially asynchronous computers, is through the use of "events," where the occurrence of predetermined conditions constitute the event. For example, where the predetermined conditions arc the transition on a signal line from one state (such as a voltage level) to another state ("transition signalling"), each change in state of the signal would constitute an event. If a system uses a single conductor for transmission of events, an event is indicated by the change in state on that conductor. For example, a change in state could be indicated when the voltage on the conductor is either raised or lowered from its previous condition. The resulting edge, rising or falling, denotes the occurrence of an event. For example, the conductor may be initially at a low potential, such as 0 volts. If a potential source then is switchably coupled to the conductor, the potential of the conductor changes to a different potential, signalling an event. When the potential source is disconnected, the conductor returns to its 0 volt state, signalling another event. The rising edge and the falling edge both designate the occurrence of events. In other systems, an event might be indicated by only the falling edges or only the rising edges.

Whatever the predetermined conditions are, there are several logic components that are commonly found in event-driven systems. Once such logic component is a "selector." The nodes of a selector comprise two or more outputs, an event input and a control input. The selector is used to steer an event from the event input to one of the outputs, where the particular output depends on the state of a control signal applied to the control input. For example, with a binary selector, an event presented on an event input to a selector circuit is steered to one of two outputs for that selector circuit, depending upon the state of a binary control signal applied to the control input of the selector circuit. If the control signal is in a first binary state, then the input event at the input to the selector will cause an output event on one output, and if the control signal is in the other binary state, then the input event will cause an output event on the other output.

The general functionality of selector circuits is well known. See, for example, U.S. Pat. No. 5,742,182, issued to Sutherland and assigned to the assignee of the present application, which is incorporated herein by reference for all purposes (hereinafter referred to as "Sutherland"). The selector circuit described therein is useful for many applications, but often a circuit design is constrained to require a high-speed response from a selector and is constrained to a low component count.

This invention provides an improved selector circuit, for high-speed and low component count uses.

SUMMARY OF THE INVENTION

The present invention provides a selector circuit useful for high-speed operation with a low component count. A selector circuit is a logic element used in digital systems, particularly those employing event logic. The present invention may be used in many types of digital circuits and systems, for example, computer systems or microprocessors.

The selector circuit of this invention provides for rapidly steering an event from a single input to one of two outputs depending on the binary value of a data signal controlling the selector. In operation, events are received at an event input. A selection value, placed at a control input causes the selector circuit to steer the event to one of the outputs. For each change of value at the event input, one or the other of the outputs will change. Which output changes is determined by the selection value applied to the control input. One embodiment of a selector circuit according to the present invention uses variable capacitances at the outputs to control which of the outputs changes in response to an input event.

If the selector circuit uses complementary signalling, each node of the selector circuit includes a true line for carrying a true signal and a complement line for carrying a complement signal. Pass gates are used to either couple the true lines of the outputs together and couple the complement lines of the outputs together or to couple the true line of one output to the complement line of the other output and couple the true line of the other output to the complement line of the one output.

BRIEF DESCRIPTION OF THE DRAWINGS

FIG. 1 is a block diagram of a selector circuit.

DESCRIPTION OF THE SPECIFIC EMBODIMENTS

In the figures, like elements are labelled with like numbers and different instances of like elements are labelled with like numbers and different parenthetical numbers or letters. Herein, the following terminology is used: a "node" is an input into, or an output from, a circuit. Where complimentary signalling is used, a node comprises a true line carrying a true signal and a complement line carrying a complement signal. Thus, when complementary signalling is used, a signal comprises a true signal and a complement signal. As is well known in the art of complementary signalling, a true signal and its corresponding complement signal are normally (i.e., when the signals are stable) opposites. A true signal is designated herein by a capital letter, such as "A" and its corresponding complement signal is designated by the capital letter with an overbar, such as "$\overline{A}$".

Figure 1A:
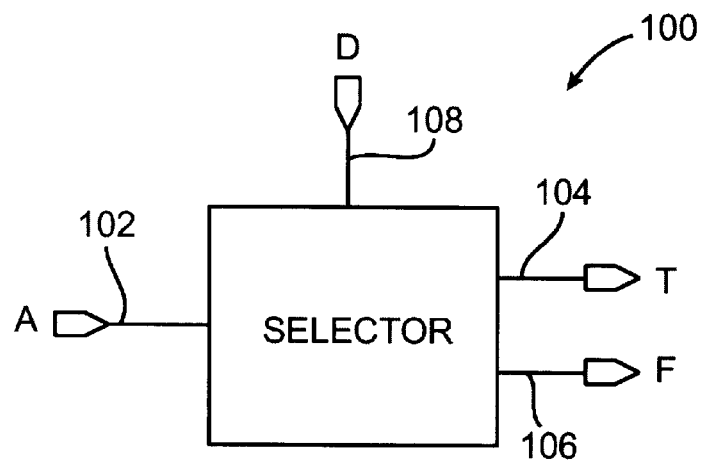
in FIG. 1(a), each input and output is shown by a single line.

FIG. 1(a) is a block diagram of a selector circuit (or "selector" for short) 100 having an input A 102, two outputs T 104 and F 106 and a control input D 108. As with other selectors, in the operation of selector 100, an event occurring on input A 102 is steered from input A 102 to one of outputs T 104 and F 106. Specifically, in this example, if control input D 108 is high, then events on input A 102 cause events on output T 104 and if control input D 108 is low, then events on input A 102 cause events on output F 106. It should be noted that while "T" and "F" are commonly used to denote "True" and "False," respectively, and control input D might symbolize, in a particular circuit, a true/false state of a signal, it should be understood that selector 100 would work equally well regardless of what the high or low signals on control input D represented.

Figure 1B:
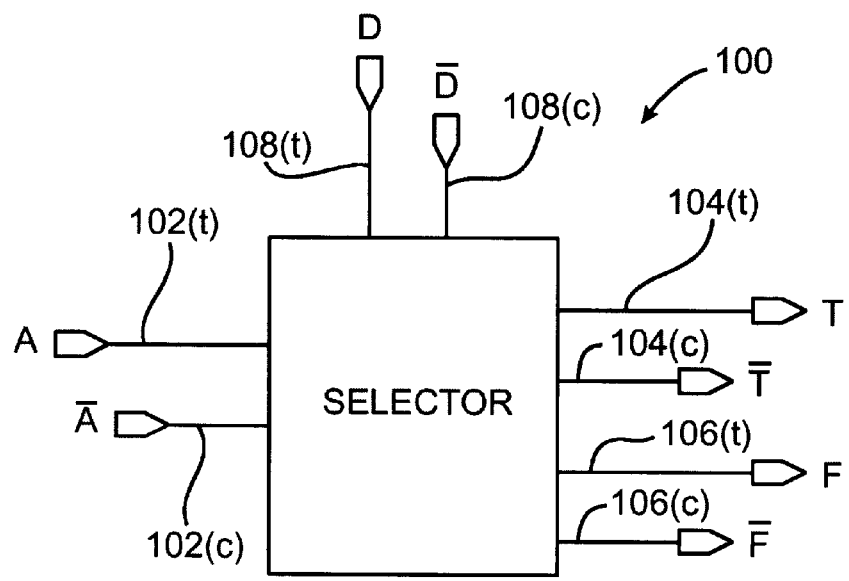
in FIG. 1(b), each input and output is shown with a true line and a complement line.

FIG. 1(b) is a block diagram of selector circuit 100 showing more detail for its external connections. In particular, each of the external nodes 102, 104, 106, 108 includes two lines: a true signal line (e.g., 102(t), 104(t), 106(t), 108(t)) and a complement signal line (e.g., 102(c), 104(c), 106(c), 108(c)).

Figure 2:
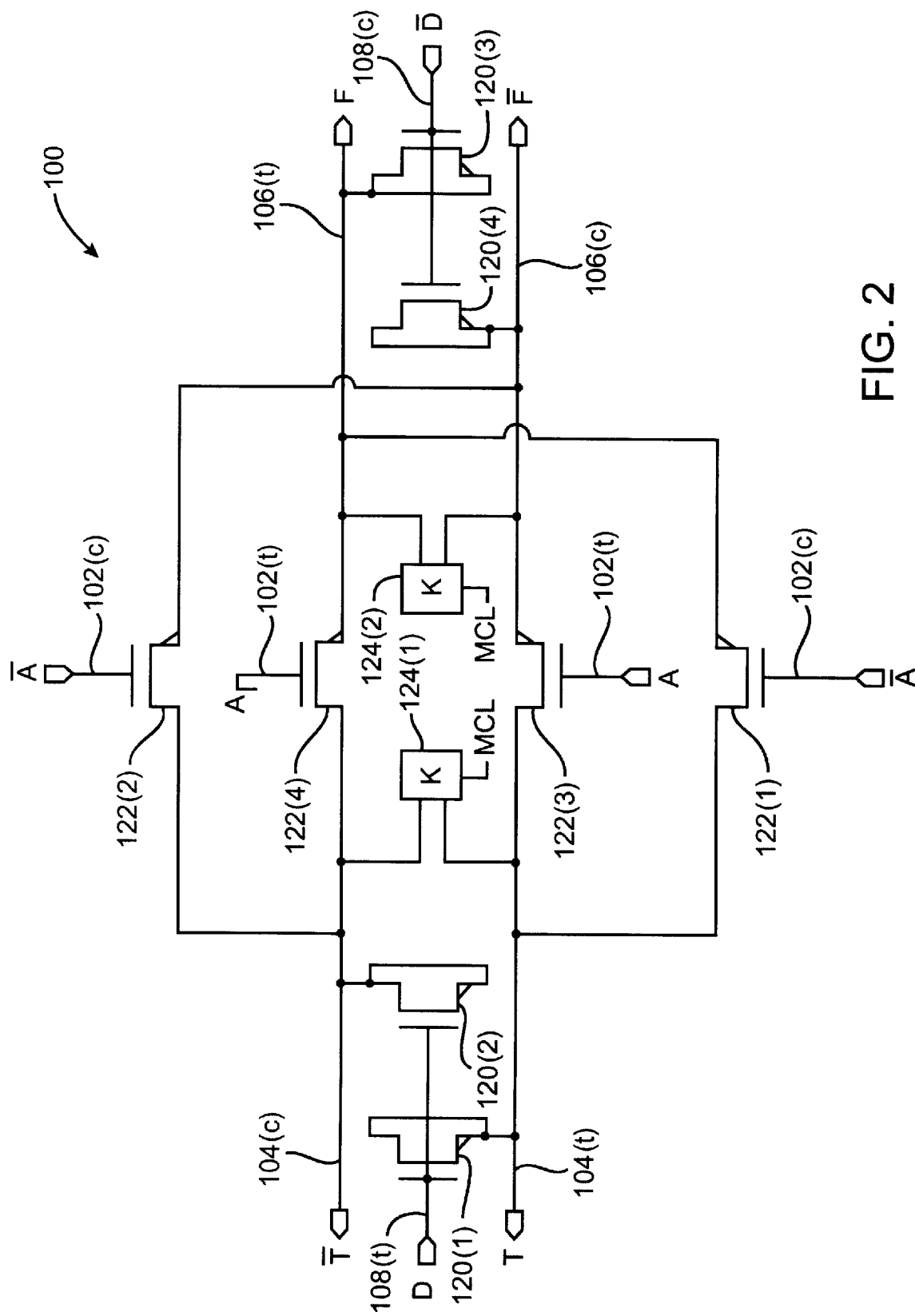
FIG. 2 is a schematic diagram of one embodiment of a selector circuit, for complementary signals, according to the present invention.

FIG. 2 is a schematic of an embodiment of a selector according to the present invention. As shown there, selector 100 comprises four voltage variable capacitors (VVC's) 120, four pass gates 122 and two keepers 124. In the circuit shown in FIG. 2, a VVC is implemented by a MOS transistor (in this case, an NMOS transistor) with its source and drain tied together and tied to one of the outputs and the gate of the MOS transistor tied to a control input. VVC 120(1) is coupled to line T, VVC 120(2) is coupled to line $\overline{T}$, VVC 120(3) is coupled to line F, and VVC 120(4) is coupled to line $\overline{F}$. The gates of VVC's 120(1) and 120(2) are coupled to line D, while the gates of VVC's 120(3) and 120(4) are coupled to line $\overline{D}$. As for the pass gates 122, pass gate 122(1) is coupled between line T and line F, pass gate 122(2) is coupled between line $\overline{T}$ and line $\overline{F}$, pass gate 122(3) is coupled between line T and line $\overline{F}$, and pass gate 122(4) is coupled between line $\overline{T}$ and line F. The gates of pass gates 122(1) and 122(2) are coupled to line $\overline{A}$, while the gates of pass gates 122(3) and 122(4) are coupled to line A. In an alternative embodiment of a VVC (not shown), the source/drain of the MOS transistor is tied to the control input line and the gate of the MOS transistor is tied to the output line. While the selector above is described as using NMOS transistors, other types of transistors might be used instead, such as PMOS, GAs, SOI (Silicon on insulator) transistors.

Keepers 124 attempt to maintain the voltages at the output signal lines and their complements, but they are weakly driven keepers. Because keepers 124 are only weakly driven, they can be overcome by a sufficient opposing voltage on the keeper terminals. Keeper 124(1) is coupled between line T and line $\overline{T}$, while keeper 124(2) is coupled between line F and line $\overline{F}$. Keepers 124 include master clear (MCL) inputs, to allow them to be set to known states. Preferably, the MCL inputs of each of the keepers is tied to one reset signal.

In operation, when A is high, the pass gates connect line T to line $\overline{F}$ and line $\overline{T}$ to line F, so the values of T and F outputs are different. When A is low, the pass gates connect line T to line F and line $\overline{T}$ to line $\overline{F}$, so the values of the T and F outputs are the same.

Just before an event arrives at input A, suppose line D is low (and line $\overline{D}$ is high) and A is low (so T and F are the same). At that point, having D applied to the gates of VVC's 120(1)–(2) results in them placing less capacitance on lines T/$\overline{T}$ than VVC's 120(3)–(4) place on lines F/$\overline{F}$, since the latter VVC's have their gates coupled to $\overline{D}$, which is high. As a result, when an event does arrive at input A (i.e., a transition from low to high), line $\overline{T}$ is coupled to line F and line T is coupled to line $\overline{F}$. Because of this coupling, the T and F outputs must go from being the same to being opposite. Since the T/$\overline{T}$ lines have less capacitance on them, output T changes state while output F remains the same, thus steering the event (a transition) from input A to output T. In most cases, the exact voltage levels on the F/$\overline{F}$ outputs will initially start to transition, but the action of the transitioned T/$\overline{T}$ lines and keeper 124(2) will move the F/$\overline{F}$ outputs back to where they were before T transitioned.

The variable voltage capacitances are provided by the gate capacitance of the NMOS devices. When the voltage on the gate of an NMOS device increases, its gate capacitance increases. Therefore, in selector 100, when control input line D is high, the capacitance on the T/$\overline{T}$ outputs is greater than the capacitance on the F/$\overline{F}$ outputs. When the pass gates switch, the charge on the T/$\overline{T}$ outputs is shared with the charge on the F/$\overline{F}$ outputs to which they are connected. Because the T/$\overline{T}$ outputs have more charge on them, due to the higher capacitance, the charge sharing will affect the voltage on those outputs less severely than on the F/$\overline{F}$ outputs. As a result, the logic value on the T output will be maintained (but may temporarily dip, as explained above) while the logic value of the F output will switch.

Keepers 124 oppose any changes in state of their respective outputs, but keeper 124(1) is overcome by the larger capacitance of VVC's 120(3) and 120(4) when pass gates 122(3) and 122(4) are turned on. Once keeper 124(1) is overcome, it then stabilizes output T to its new value. During the transition, keeper 124(2) works to keep output F from changing, and while lines F/$\overline{F}$ dip as the charge on those lines is shifted over to lines T/$\overline{T}$, they don't change state and keeper 124(2) stabilizes those lines at the steady state they were at before the transition.

Because the charge used to transition the lines at one output is obtained from the other output, less current is drawn from the power supplies, which lowers the overall current requirement for the circuit. In this way, the charge on the outputs is shared between them. In addition to lowering the overall current requirement, the response time is shorter since the charge needed to transition an output is already available at the other output.

Figure 3:
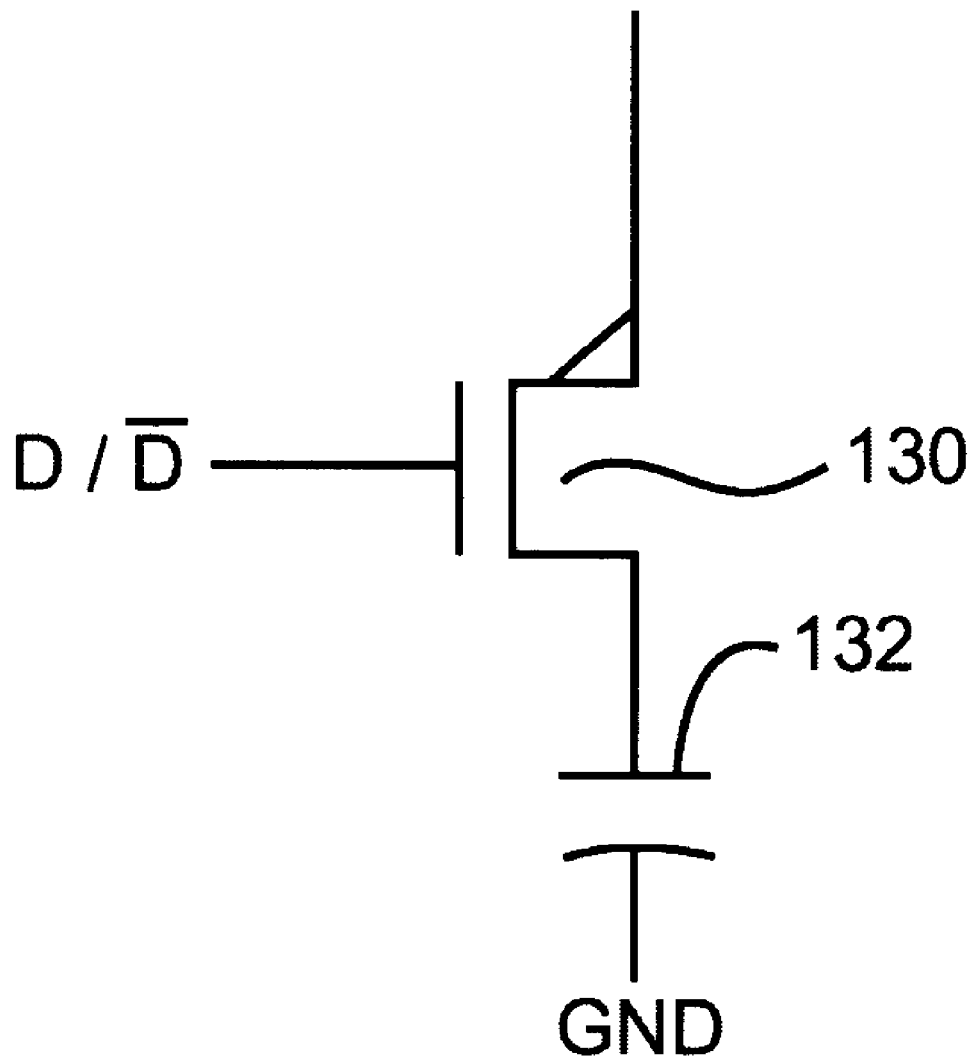
FIG. 3 is a schematic diagram of an alternate embodiment of a variable capacitive element as might be used in the circuit of FIG. 2.

If the amount of capacitance needed is more than can be obtained by single transistors, the VVC's can be made from alternative elements or from a plurality of single transistors operating in unison (gangled VVC's). One example is shown in FIG. 3. There, a switching transistor 130 and a capacitor are coupled in series between an output line (T, $\overline{T}$, F, or $\overline{F}$) and ground. The gate of switching transistor 130 is connected to either D or $\overline{D}$, depending on which the line to which the circuit of FIG. 3 is connected. Thus, when the gate is activated, the capacitance of capacitor 132 is coupled to the output line. Too much capacitance on the output lines can be a problem, however, when D switches. When D switches, the capacitances on the output lines change and there is charge sharing as the capacitance on one output is charging the capacitance on the other output. If there is too much charge sharing when D switches, the resulting large spikes might be enough to switch the keepers. It should be apparent from this description that other components could be used in place of the VVC's. For example, another circuit that provides for variable capacitance could be used in place of the VVC's.

Figure 4A:
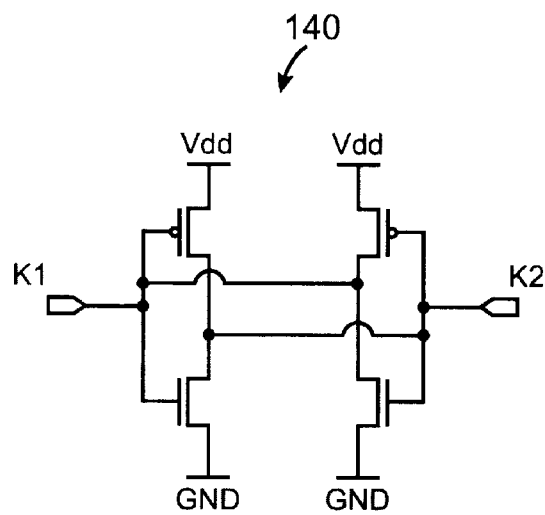
FIGS. 4(a)–(c) are schematic diagrams of several examples of keepers as might be used in the selector circuit of FIG. 2.
Figure 4B:
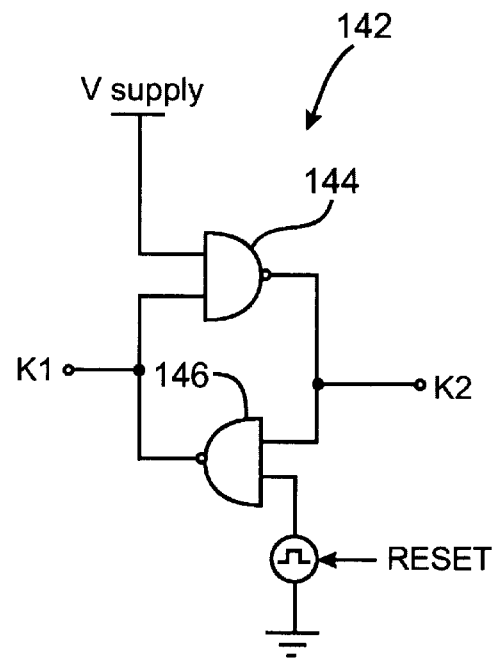
Figure 4C:
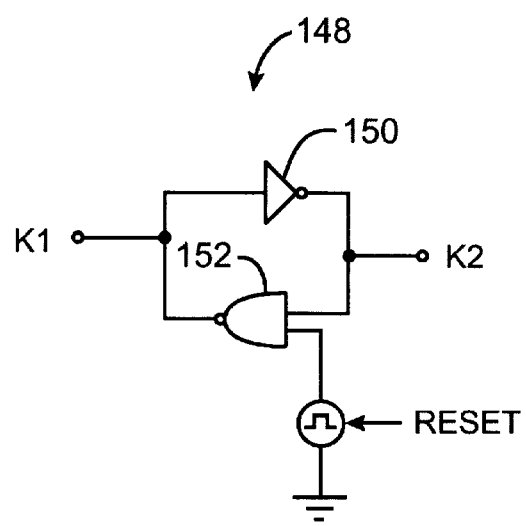

Several examples of keeper circuits, as might be used in selector 100 as keeper 124, are shown in FIGS. 4(a)–(c). A keeper maintains a voltage of each of its terminals until a voltage on those terminals overcomes the keeper's action and forces the keeper terminals to other voltages. Consequently, a keeper functions to oppose voltage change on its one or more terminals, but not too strongly. FIG. 4(a) shows a basic keeper 140 comprising two cross-coupled inverters. FIG. 4(b) shows a balanced keeper 142 with reset capability comprising two NAND gates 144, 146. In that keeper, when a reset is triggered, a low pulse is provided to an input of NAND gate 146, which sets keeper output K1 high and keeper output K2 low. FIG. 4(c) shows an unbalanced keeper 148 comprising an inverter 150 and a NAND gate 152. Although this keeper is unbalanced, it can be built with two fewer transistors than balanced keeper 142 (FIG. 4(b)), thus reducing the chip area and power requirements of a selector circuit in which the keeper is used.

Figure 5:
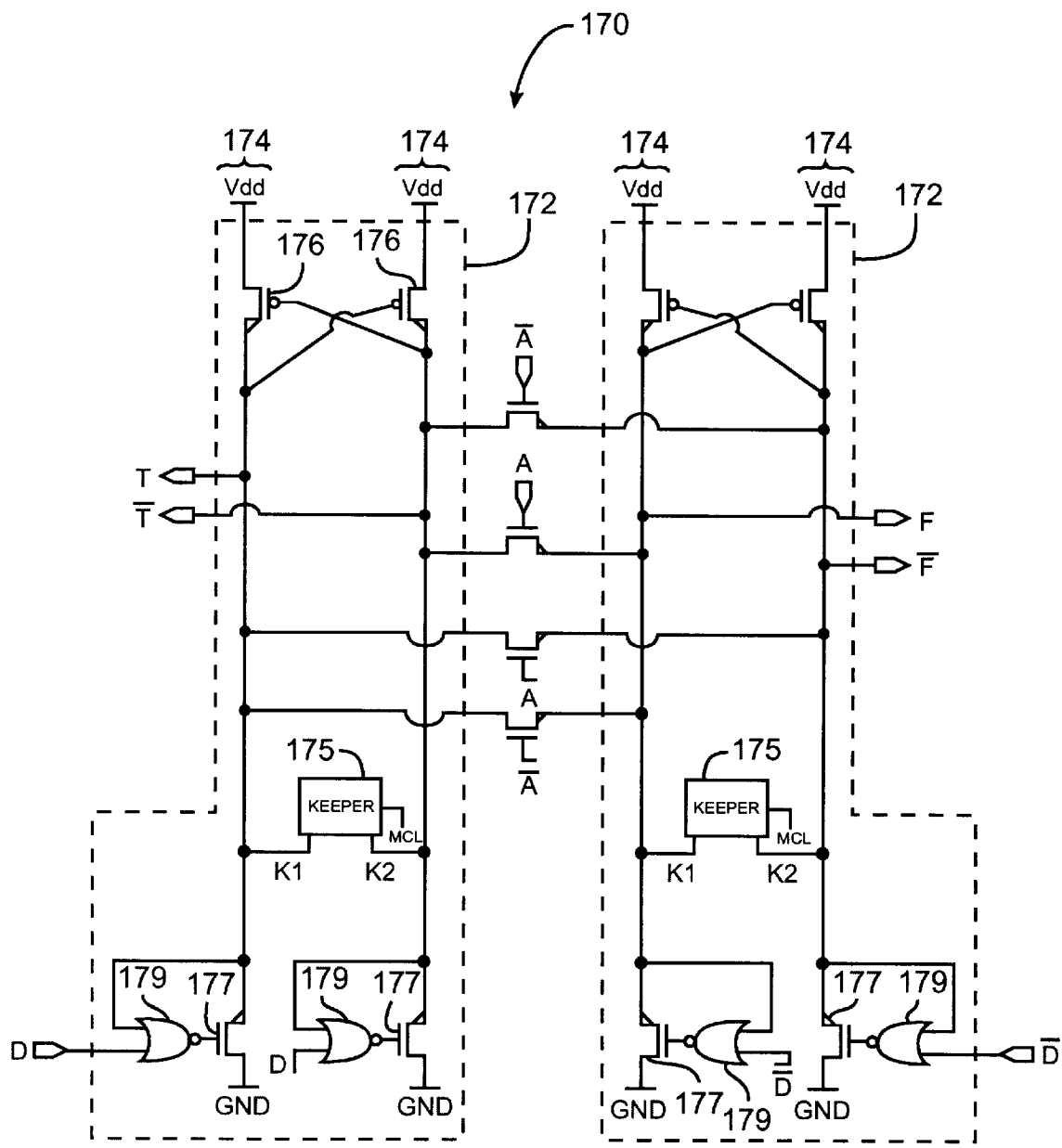
FIG. 5 is a schematic diagram of an alternate embodiment of a selector circuit.

A selector circuit based on VVC's has now been described. An alternate selector circuit 170 is shown in FIG. 5. There, selector circuit 170 comprises two flip-flop units 172 and a pass gate network similar to that of selector circuit 100 shown in FIG. 2. Each flip-flop unit 172 comprises two symmetric output sections 174 with a keeper 175 between the output lines. Each output section 174 comprises a PMOS transistor 176 connected between the supply and the Output and an NMOS transistor 176 connected between the output and ground. The gates of PMOS transistors 177 are connected to their opposite output section's output line and the gates of NMOS transistors 177 are connected to the output of a NOR gate 179, which is a NOR of the output and one of the lines of the control signal D/$\overline{D}$. The NOR gates 179 of the T/$\overline{T}$ output sections are connected to the D line, while the NOR gates 179 of the F/$\overline{F}$ output sections are connected to the $\overline{D}$ line.

These output sections of selector circuit 170 differ from the output sections of the selector circuit shown in Sutherland in that one of the series transistors used in the output section of Sutherland is omitted in each of the output sections 174 of selector circuit 170. This results in shorter delays between a transition on the A input and the output of an event, but at the cost of increased setup time, which is the time needed after the value of D changes before a new event can arrive on A.

Figure 6:
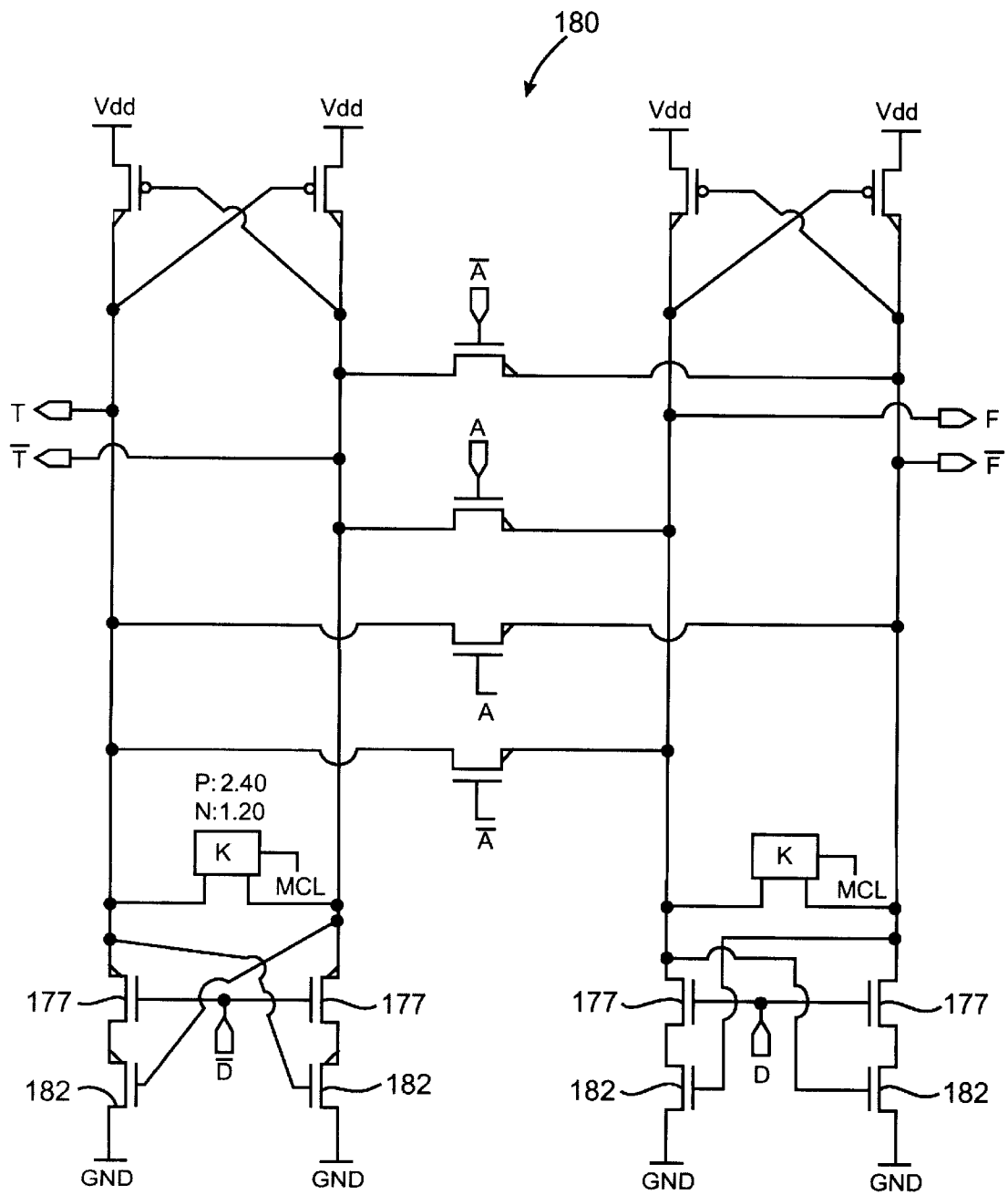
FIG. 6 is a schematic diagram of yet another embodiment of a selector circuit, similar to the selector circuit of FIG. 5.

As shown in FIG. 6, an alternative to NOR gates 179 is to use a second NMOS transistor 182 in series with each NMOS transistor 177 in each output section 174, as in a selector circuit 180. The gates of NMOS transistors 182 are coupled to their opposite output line. With this arrangement, the opposite line of the control channel is used, i.e., the gates of NMOS transistors 177 of the T output sections are coupled to $\overline{D}$, while the gates of NMOS transistors 177 of the $\overline{T}$ output sections are coupled to D.

In summary, a novel selector circuit has now been described, including several variations. The foregoing description of preferred embodiments of the invention has been presented for the purposes of description. It is not intended to be exhaustive or to limit the invention to the precise form described, and modifications and variations are possible in light of the teaching above. For example, given the explanation above, it will be appreciated that selector circuits can be designed using the principles of this invention which select an input event to pass to any one of a group of output lines in response to a multiple bit control signal.

What is claimed is:

1. A selector circuit, wherein an event occurring at an input is reflected at a selected output of a plurality of outputs, wherein the selected output is selected based on a state of a control input, comprising:

a plurality of variable capacitance elements, wherein each of the variable capacitance elements is coupled to a different line of the lines of the plurality of outputs; and a plurality of control lines coupling the control input to each of the plurality of variable capacitance elements such that a capacitance of the variable capacitance element varies based on the signal at a corresponding control line, the variation in capacitance being sufficient to transfer an event from the input to the selected output without transferring the event to an unselected output.

2. The selector circuit of claim 1, wherein the plurality of outputs comprises two outputs and the signal at the control input is a binary signal selecting among the two outputs.

3. The selector circuit of claim 1, wherein each of the plurality of variable capacitance elements comprises a switch element and a capacitive element.

4. The selector circuit of claim 1, wherein each of the plurality of variable capacitance elements comprises a dynamic capacitor.

5. The selector circuit of claim 1, wherein each output comprises two output lines, a true line and a complement line, and wherein each of the plurality of variable capacitance elements comprises a MOS, SOI or GAs transistor having its drain and source coupled to an output line associated with the variable capacitance element and having its gate coupled to the control line associated with the variable capacitance element.

6. The selector circuit of claim 1, wherein each output comprises two output lines, a true line and a complement line, and wherein each of the plurality of variable capacitance elements comprises a MOS, SOI or GAs transistor having its drain and source coupled to the control line associated with the variable capacitance element and having its gate coupled to an output line associated with the variable capacitance element.

7. A selector circuit comprising:

an input including an input true line for carrying an input true signal and an input complement line for carrying an input complement signal;

a first output including a first output true line and a first output complement line;

a second output including a second output true line and a second output complement line;

a control input for carrying a control signal, including a control input true line for carrying a control input true signal and a control input complement line for carrying a control input complement signal;

a first voltage variable capacitive element, coupled to the first output true line and having a capacitance which varies as a function of the control input true signal;

a second voltage variable capacitive element, coupled to the first output complement line and having a capacitance which varies as a function of the control input true signal;

a third voltage variable capacitive element, coupled to the second output true line and having a capacitance which varies as a function of a control input complement signal;

a fourth voltage variable capacitive element, coupled to the second output complement line and having a capacitance which varies as a function of the control input complement signal;

a first pass gate for coupling the first output true line and the second output true line when the input complement signal is asserted;

a second pass gate for coupling the first output complement line and the second output complement line when the input complement signal is asserted;

a third pass gate for coupling the first output true line and the second output complement line when the input true signal is asserted; and a fourth pass gate for coupling the first output complement line and the second output true line when the input true signal is asserted.

8. The selector circuit of claim 7, further comprising:

a first keeper circuit, coupled between the first output true line and the first output complement line, for maintaining a state of the first output when the control input true signal is unasserted; and a second keeper circuit, coupled between the second output true line and the second output complement line, for maintaining a state of the second output when the control complement signal is unasserted.

9. A selector circuit, wherein an event occurring at an input is reflected at a selected output of plurality of outputs, wherein the selected output is selected based on a state of control input, comprising:

a plurality of variable capacitance means for providing a variable capacitance in response to a capacitance input, wherein each of the variable capacitance means is coupled to a different line of the lines of the plurality of outputs; and a plurality of control means, each coupling the control input to one of the plurality of variable capacitance means, for varying a capacitance of the variable capacitance means based on the signal from a corresponding control means, the variation in capacitance being sufficient to transfer an event from the input to the selected output without transferring the event to an unselected output.

10. The selector of claim 9, wherein each of the plurality of variable capacitance means comprises a switch means for switching the capacitive input and a capacitive means for providing capacitance.

* * * * *